United States Patent
Wei et al.

(10) Patent No.: US 12,100,605 B2
(45) Date of Patent: Sep. 24, 2024

(54) GAS PURGE DEVICE AND GAS PURGING METHOD

(71) Applicant: NANYA TECHNOLOGY CORPORATION, New Taipei (TW)

(72) Inventors: Meng-Liang Wei, Taoyuan (TW); Sun-Fu Chou, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 18/381,898

(22) Filed: Oct. 19, 2023

(65) Prior Publication Data
US 2024/0047251 A1 Feb. 8, 2024

Related U.S. Application Data

(62) Division of application No. 17/077,849, filed on Oct. 22, 2020, now Pat. No. 12,027,399.

(51) Int. Cl.
*H01L 21/673* (2006.01)
*H01L 21/02* (2006.01)

(52) U.S. Cl.
CPC .. *H01L 21/67393* (2013.01); *H01L 21/02046* (2013.01)

(58) Field of Classification Search
CPC ............. H01L 21/67393; H01L 21/02046
See application file for complete search history.

(56) References Cited

U.S. PATENT DOCUMENTS

| 5,988,233 A | 11/1999 | Fosnight et al. |
| 2013/0213442 A1 | 8/2013 | Kaise et al. |
| 2017/0221743 A1* | 8/2017 | Kondoh ............ H01L 21/67389 |
| 2022/0020620 A1* | 1/2022 | Huang ............. H01L 21/67253 |

OTHER PUBLICATIONS

Office Action and and the search report mailed on Jan. 30, 2024 related to U.S. Appl. No. 17/077,849, wherein this application is a Div of U.S. Appl. No. 17/077,849.

* cited by examiner

*Primary Examiner* — Jason K Niesz
(74) *Attorney, Agent, or Firm* — Xuan Zhang

(57) ABSTRACT

A gas purge device includes a first nozzle and a gas gate. The first nozzle is coupled to a front-opening unified pod (FOUP) through a first port of the FOUP. The gas gate is coupled to the first nozzle via a first pipe. The gas gate includes a first mass flow controller (MFC), a second MFC, and a first switch unit. The first MFC is configured to control a first flow of a first gas. The second MFC is configured to control a second flow of a second gas. The first switch unit is coupled to the first MFC and the second MFC, and is configured to provide the first gas to the first nozzle through the first pipe or receive the second gas from the first nozzle through the first pipe according to a process configuration.

16 Claims, 20 Drawing Sheets

GAS PURGE DEVICE AND GAS PURGING METHOD

CROSS-REFERENCE TO RELATED APPLICATION

This application is a divisional application of U.S. Non-Provisional application Ser. No. 17/077,849 filed Oct. 22, 2020, which is incorporated herein by reference in its entirety.

TECHNICAL FIELD

The present disclosure relates to a gas purge device and a gas purge method, and more particularly, to a gas purge device and a gas purge method for purging a wafer container to clean wafers.

DISCUSSION OF THE BACKGROUND

In the semiconductor industry, a wafer container is used for storing wafers. During the processing of the wafers, airborne molecular contamination (AMC) can enter the wafer container and damage the wafers in the wafer container. Various techniques that use gas to purge AMC from the wafer container have been introduced. However, different purging processes with different gases must be performed on different devices, which is very inefficient and high in cost.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a gas purge device, including a first nozzle and a gas gate. The first nozzle is coupled to a front-opening unified pod (FOUP) through a first port of the FOUP. The gas gate is coupled to the first nozzle via a first pipe. The gas gate includes a first mass flow controller (MFC), a second MFC, and a first switch unit. The first MFC is configured to control a first flow of a first gas. The second MFC is configured to control a second flow of a second gas. The first switch unit is coupled to the first MFC and the second MFC, and is configured to provide the first gas to the first nozzle through the first pipe or receive the second gas from the first nozzle through the first pipe according to a process configuration.

In some embodiments, the gas purge device further includes a second nozzle coupled to the FOUP. The gas gate is further coupled to the second nozzle via a second pipe. The gas gate further includes a third MFC, a fourth MFC, and a second switch unit. The third MFC is configured to control a third flow of the first gas. The fourth MFC is configured to control a fourth flow of the second gas. The second switch unit is coupled to the third MFC and the fourth MFC, and configured to provide the first gas to the second nozzle through the second pipe or receive the second gas from the second nozzle through the second pipe according to the process configuration.

In some embodiments, when the first gas is provided to the first nozzle by the first switch unit, the second gas is received from the second nozzle by the second switch unit.

In some embodiments, the gas purge device further includes a third nozzle coupled to the FOUP and a fourth nozzle coupled to the FOUP. The gas gate is further coupled to the third nozzle and the fourth nozzle via a third pipe and a fourth pipe, respectively. The gas gate further includes a fifth MFC, a sixth MFC, a seventh MFC, an eighth MFC, a third switch unit and a fourth switch unit. The fifth MFC is configured to control a fifth flow of the first gas. The sixth MFC is configured to control a sixth flow of the second gas. The seventh MFC is configured to control a seventh flow of the first gas. The eighth MFC is configured to control an eighth flow of the second gas. The third switch unit is coupled to the fifth MFC and the sixth MFC, and configured to provide the first gas to the third nozzle through the third pipe or receive the second gas from the third nozzle through the third pipe according to the process configuration. The fourth switch unit is coupled to the seventh MFC and the eighth MFC, and configured to provide the first gas to the fourth nozzle through the fourth pipe or receive the second gas from the fourth nozzle through the fourth pipe according to the process configuration.

In some embodiments, the first gas is provided to the first nozzle by the first switch unit, and the second gas is received from the second nozzle, the third nozzle and the fourth nozzle by the second switch unit, the third switch unit and the fourth switch unit, respectively.

In some embodiments, the first gas is provided to the first nozzle and the third nozzle by the first switch unit and the third switch unit, respectively, and the second gas is received from the second nozzle and the fourth nozzle by the second switch unit and the fourth switch unit, respectively.

In some embodiments, the first gas is provided to the first nozzle, the third nozzle and the fourth nozzle by the first switch unit, the third switch unit and the fourth switch unit, respectively, and the second gas is received from the second nozzle by the second switch unit.

In some embodiments, the gas gate further includes a controller. The controller is configured to control the first switch unit, the second switch unit, the third switch unit, the fourth switch unit, the first MFC, the second MFC, the third MFC, the fourth MFC, the fifth MFC, the sixth MFC, the seventh MFC and the eighth MFC.

In some embodiments, the controller is further configured to receive a sensing signal generated by a sensor, wherein the sensor is configured to sense humidity, a concentration of the first gas, and/or a concentration of second gas of the FOUP. The controller further controls the first switch unit, the second switch unit, the third switch unit, the fourth switch unit, the first MFC, the second MFC, the third MFC, the fourth MFC, the fifth MFC, the sixth MFC, the seventh MFC and the eighth MFC according to the sensing signal.

In some embodiments, the controller is implemented by a programmable logic controller (PLC).

In some embodiments, the gas purge device further includes a mechanism configured to be clamped and connected to the FOUP.

In some embodiments, the gas purge device is configured to provide the first gas to wafers in the FOUP. The wafers are 12-inch and/or 18-inch wafers.

In some embodiments, the first switch unit includes a first valve and a second valve. The first valve is configured to be opened to provide the first gas to the first nozzle. The second valve is configured to be opened to receive the second gas from the first nozzle. When the first valve is open, the second valve is closed. When the first valve is closed, the second valve is open.

In some embodiments, the gas gate further includes a ninth MFC configured to control a ninth flow of a third gas. The third gas is different from the first gas and the second gas. The first switch unit is further coupled to the ninth MFC, and configured to provide the third gas to the first nozzle through the first pipe.

In some embodiments, the gas gate further includes a tenth MFC configured to control a tenth flow of a fourth gas. The fourth gas is different from the first gas, the second gas and the third gas. The first switch unit is further coupled to the tenth MFC, and configured to provide the fourth gas to the first nozzle through the first pipe.

Another aspect of the present disclosure provides a method including the following operations: receiving, by a gas purge device, a front-opening unified pod (FOUP) with wafers therein; determining a first number of first intake ports of the gas purge device and a second number of second exhaust ports of the gas purge device; and, based on the first number and the second number, cleaning the wafers in the FOUP. Cleaning the wafers includes: providing, by a gas gate of the gas purge device, a first flow of a first gas through the first intake ports to the FOUP; receiving, by the gas gate, a second flow of a second gas from the FOUP through the second exhaust ports.

In some embodiments, the cleaning of the wafer further includes: controlling the first number of switch units connected to the first intake ports to select a first gas source for providing the first gas to the FOUP; and controlling the second number of the switch units connected to the second exhaust ports to select a gas tank for receiving the second gas from the FOUP.

In some embodiments, the method further includes: determining the first flow of the first gas and the second flow of the second gas. Cleaning the wafers further includes: setting the first number of first mass flow controllers (MFCs) to have a first overall flow equal to the first flow; and setting the second number of second MFCs to have a second overall flow equal to the second flow. The first MFCs are connected to the first gas source, and the second MFCs are connected to the gas tank. A sum of the first number and the second number is equal to 4, and the first number and the second are greater than 0.

In some embodiments, the method further includes: determining a third number of third intake ports of the gas purge device. Cleaning the wafers further includes: controlling the third number of switching units connected to the third intake port to select a second gas source for providing the third gas to the FOUP; setting the third number of third MFCs to have a third overall flow equal to the third flow; and providing, by the gas gate, the third flow of a third gas through the third intake ports to the FOUP.

In some embodiments, the receiving of the FOUP includes: clamping the FOUP and the gas purge device by a clamper.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
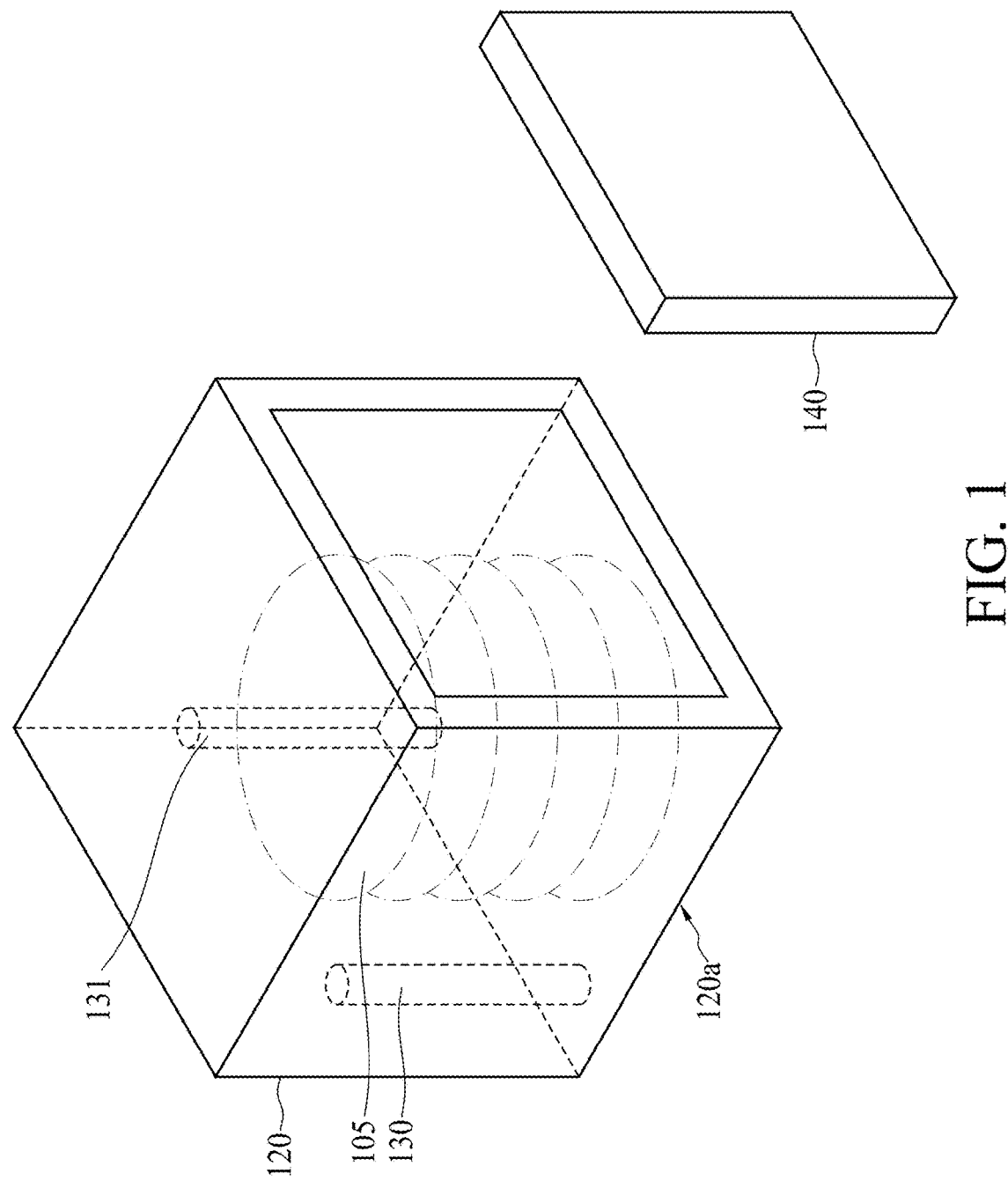
FIG. 1 is a schematic view of a front-opening unified pod (FOUP) according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of a front-opening unified pod (FOUP) according to some embodiments of the present disclosure. During the semiconductor manufacturing process, the wafers 105 are transported and stored inside the FOUP 100, as illustrated in FIG. 1. The FOUP 100 includes a container 120 and a door 140. The container 120 is configured to contain the wafers 105, and the door 140 is configured to seal the container 120 so as to form an independent environment in the container 120 for the wafers 105. In other words, when the container 120 is sealed by the door 140, the wafers 105 are isolated from environmental contamination, such as undesired particles. The FOUP 100 further includes gas pipes 130 and 131, which are configured to facilitate gas flow in the container 120.

In some embodiments, the configuration of the FOUP 100 complies with the SEMI-standard. The FOUP 100 is able to carry 12-inch wafers 105 and/or 18-inch wafers 105, and the wafers 105 are stacked from a bottom 120a of the FOUP 100.

Figure 2:
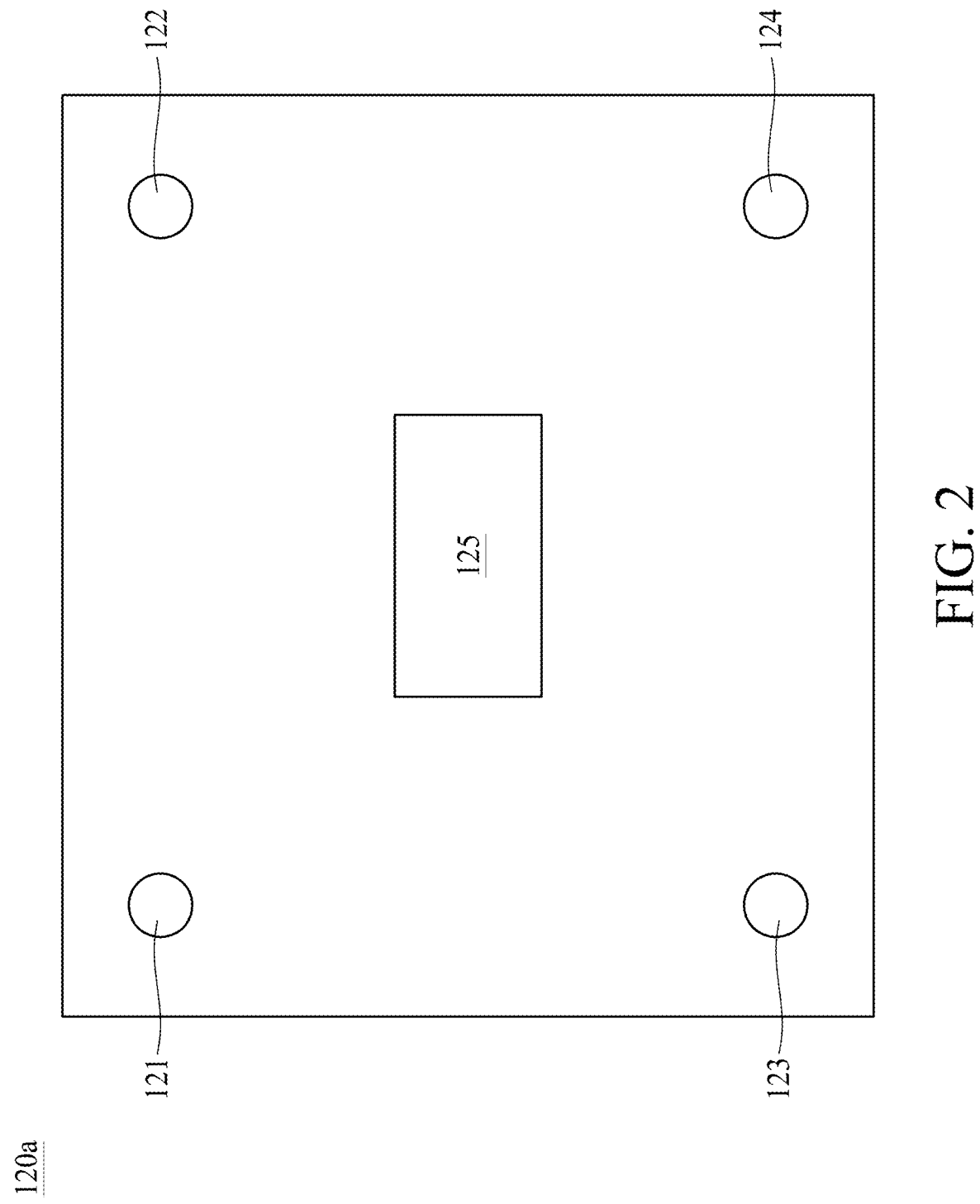
FIG. 2 is a schematic view of a bottom of the FOUP according to some embodiments of the present disclosure.
Figure 6:
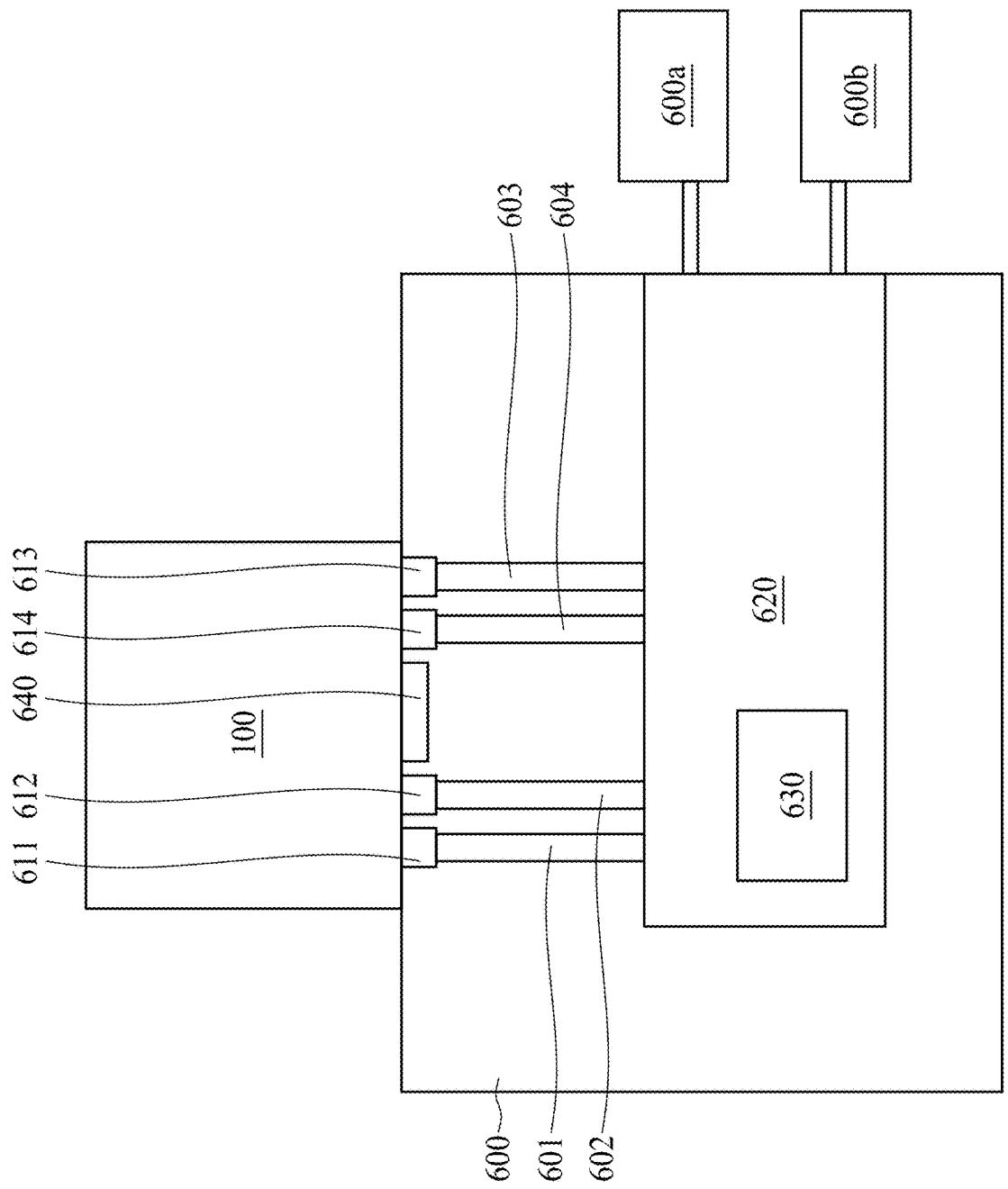
FIG. 6 is a schematic diagram of a gas purge device with the FOUP according to some embodiments of the present disclosure.

FIG. 2 is a schematic view of the bottom 120a of the FOUP 100 according to some embodiments of the present disclosure. During the semiconductor manufacturing process, the bottom 120a of the FOUP 100 serves as an interface to the semiconductor equipment for the semiconductor manufacturing process, for example, a gas purge device for purging the FOUP 100, as illustrated in FIG. 6 below.

As illustrated in FIG. 2, a port 121, a port 122, a port 123, a port 124 and a coupling groove 125 are disposed at the bottom 120a. The ports 121 to 124 are configured to transport gas for the semiconductor manufacturing process, and the coupling groove 125 is configured to be clamped so as to fix the FOUP 100 and prevent the FOUP 100 from moving during processing. For example, in previous configurations, when the wafer container is purged using a large flow of gas, the wafer container might vibrate during purging. However, when the FOUP 100 is clamped, the FOUP 100 can be secured so as to prevent movement.

Figure 3:
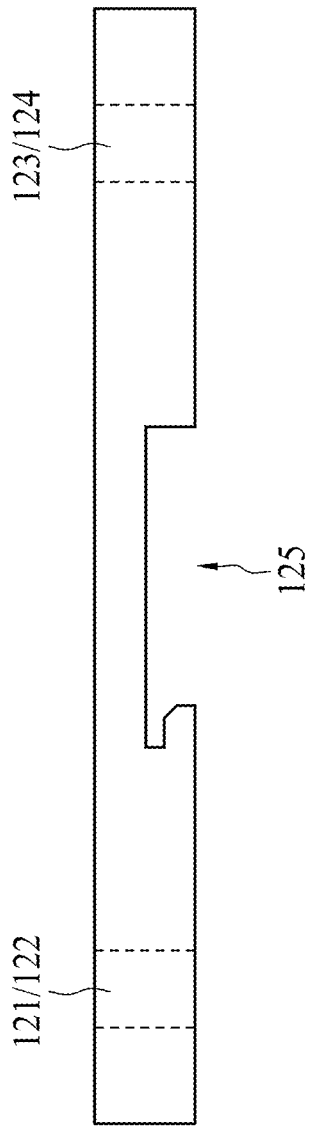
FIG. 3 is a block diagram of a side view of the bottom of the FOUP according to some embodiments of the present disclosure.

FIG. 3 illustrates a side view of the bottom 120a of the FOUP 100. The ports 121 to 124 penetrate a thickness of the bottom 120a and connect two surfaces of the bottom 120a. Therefore, the gas can be transported through the ports 121 to 124 between two surfaces of the bottom 120a. The coupling groove 125 recesses from a bottom surface of the bottom 120a so as to be easily clamped by another device.

Figure 4:
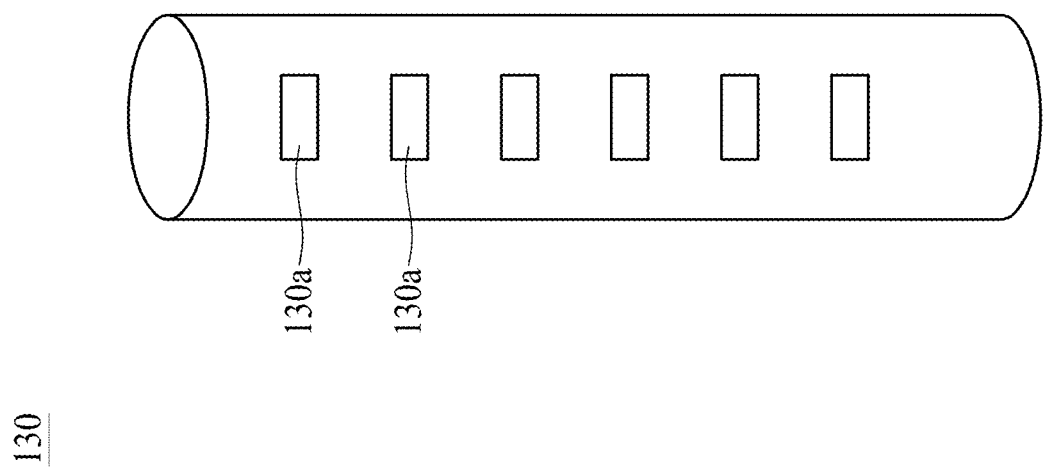
FIG. 4 is a schematic diagram of a gas pipe of the FOUP according to some embodiments of the present disclosure.

FIG. 4 illustrates the gas pipe 130 of the FOUP 100. In some embodiments, the gas pipe 130 is identical to the gas pipes 131. The gas pipe 130 includes openings 130a. The gas pipe 130 is configured to import gas to the container 120 or remove gas from the container 120. When the gas pipe 130 imports gas into the container 120, the gas is introduced into the container 120 through the openings 130a, and the gas pipe 130 is also referred to as an inlet pipe. When the gas pipe 130 removes gas from the container 120, the gas leaves the container 120 through the openings 130a, and the gas pipe 130 is also referred to as an outlet pipe.

Figure 5:
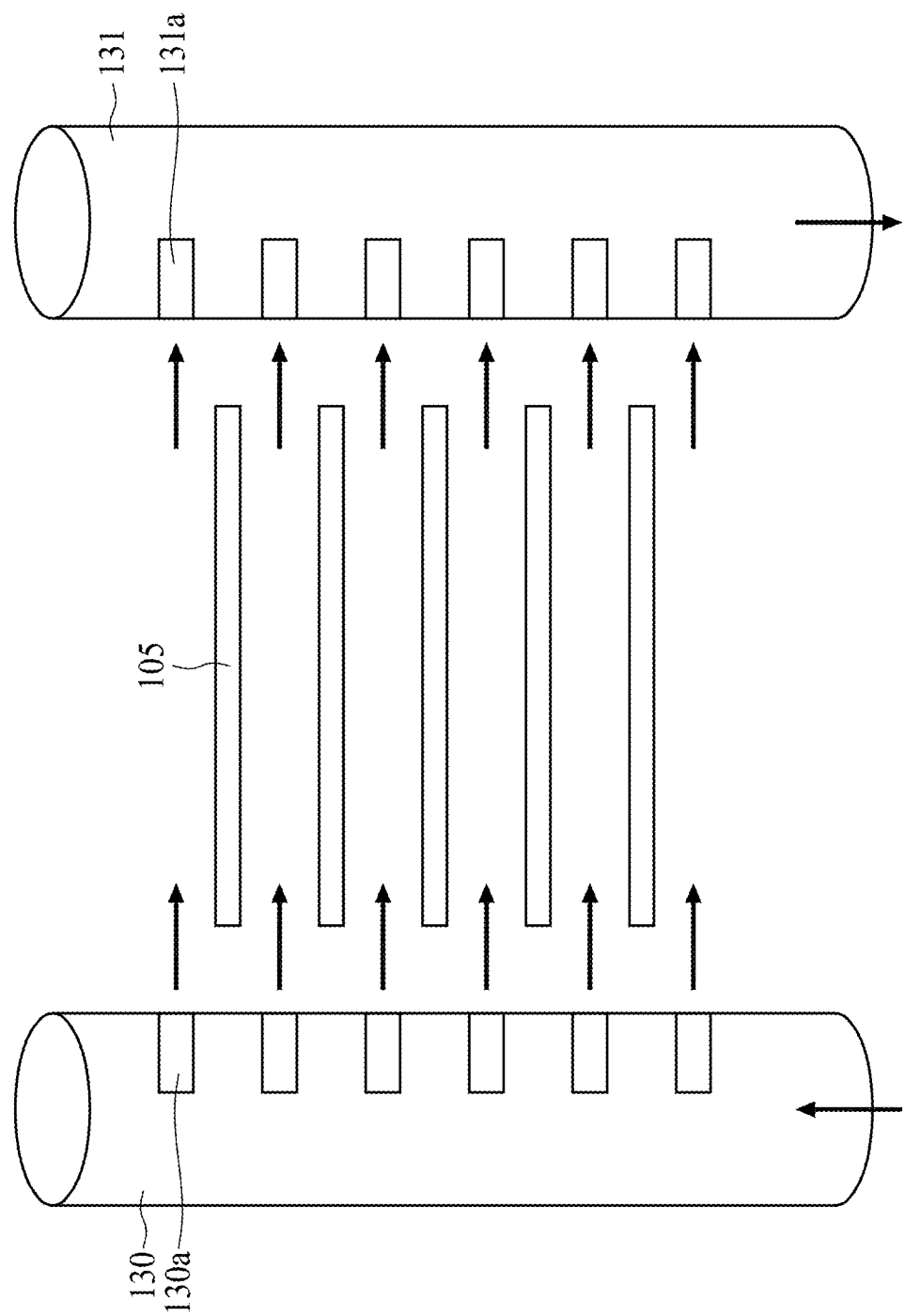
FIG. 5 is a schematic view of gas flows in the FOUP according to some embodiments of the present disclosure.

FIG. 5 illustrates a schematic view of gas flows in the FOUP 100. In some embodiments, the ports 121 and 122 correspond to the gas pipes 130 and 131, respectively. In order to prevent the transportation of wafers 105 from blocking, there is no gas pipe corresponds to the ports 123 and 124, in which the ports 123 and 124 are closer to the door 140 than the ports 121 and 122.

During the gas purge process for cleaning the wafers 105, the gas is provided to the container 120 by the inlet pipe (i.e., the gas pipe 130 in FIG. 5) and removed by the outlet pipe (i.e., the gas pipe 131 in FIG. 5). The gas pipe 130 and the gas pipe 131 extend vertically above the bottom 120a. The openings 130a and the openings 131a are substantially aligned with each other, and each pair of openings 130a/131a is substantially aligned with a space between the wafers 105. When the gas flow is distributed by the opening 130a along the space between the wafers 105, the space between the wafers 105 directs the gas flow to the opening 131a. Therefore, the space between the wafers is purged of contaminants, and the top and bottom surfaces of the wafers 105 can be cleaned by the gas flow.

FIG. 6 is a schematic diagram of a gas purge device 600 with the FOUP 100 according to some embodiments of the present disclosure. The gas purge device 600 is configured to perform a gas purge process on the wafers 105 in the FOUP 100 for cleaning the wafers 105. The gas purge device 600 receives the FOUP 100 such that the bottom 120a of the FOUP 100 serves as an interface to the gas purge device 600. The gas is transported through the bottom 120a. In some embodiments, the gas purge device 600 connects to a gas source 600a so as to provide gas, and connects to a gas tank 600b so as to remove the gas.

The gas purge device 600 includes a gas gate 620, a mechanism 640, a pipe 601, a pipe 602, a pipe 603 and a pipe 604. The pipes 601 to 604 connect to nozzles 611 to 614, respectively, and the nozzles 611 to 614 correspond to the ports 121 to 124 on the bottom 120a of the FOUP 100. The gas gate 620 couples the gas source 600a and the gas tank 600b to the pipes 601 to 604 in order to connect the gas source 600a and the gas tank 600b to the FOUP 100. The mechanism 640 is configured to connect to the coupling groove 125 of the bottom 120a of the FOUP 100 so as to make the FOUP 100 unable to move during the gas purge process. In some embodiments, the mechanism 640 is connected to the coupling groove 125 by a clamper (not shown in the drawings). The damper is configured to clamp the mechanism 640 of the gas purge device 600 and the coupling groove 125 of the FOUP 100. In this way, the FOUP 100 can stay still on the gas purge device 600 during the gas purge process.

The gas gate 620 includes a controller 630 configured to control the gas provided to the FOUP 100 and removed from the FOUP 100. More specifically, the controller 630 selects the gas source 600a or the gas tank 600b to be connected to the pipes 601 to 604. In some embodiments, the controller 630 is implemented by a programmable logic controller (PLC).

In some embodiments, the controller 630 may include a central processing unit (CPU), a microcontroller unit (MCU), other hardware circuit elements capable of executing relevant instructions, or a combination of computing circuits that are well-known by those skilled in the art based on the above disclosures.

In some embodiments, the gas source 600a is a gas cylinder which contains noble gas such as argon (Ar) or helium (He). In other embodiments, the gas source 600a contains nitrogen (N). The gas provided by the gas source 600a is introduced into the FOUP 100 and replaces the atmosphere in the FOUP 100. In some embodiments, the gas tank 600b is a vacuum pump, and the vacuum pump is configured to create a vacuum to pull the gas out of the FOUP 100 and to maintain a pressure within the FOUP 100. The gases mentioned above are provided for illustrative purposes. Various gases provided by the gas source 600 are within the contemplated scope of the present disclosure. For example, in various embodiments, the gas source 600a contains oxygen ($O_2$) or mixed air without water vapor.

Figure 7:
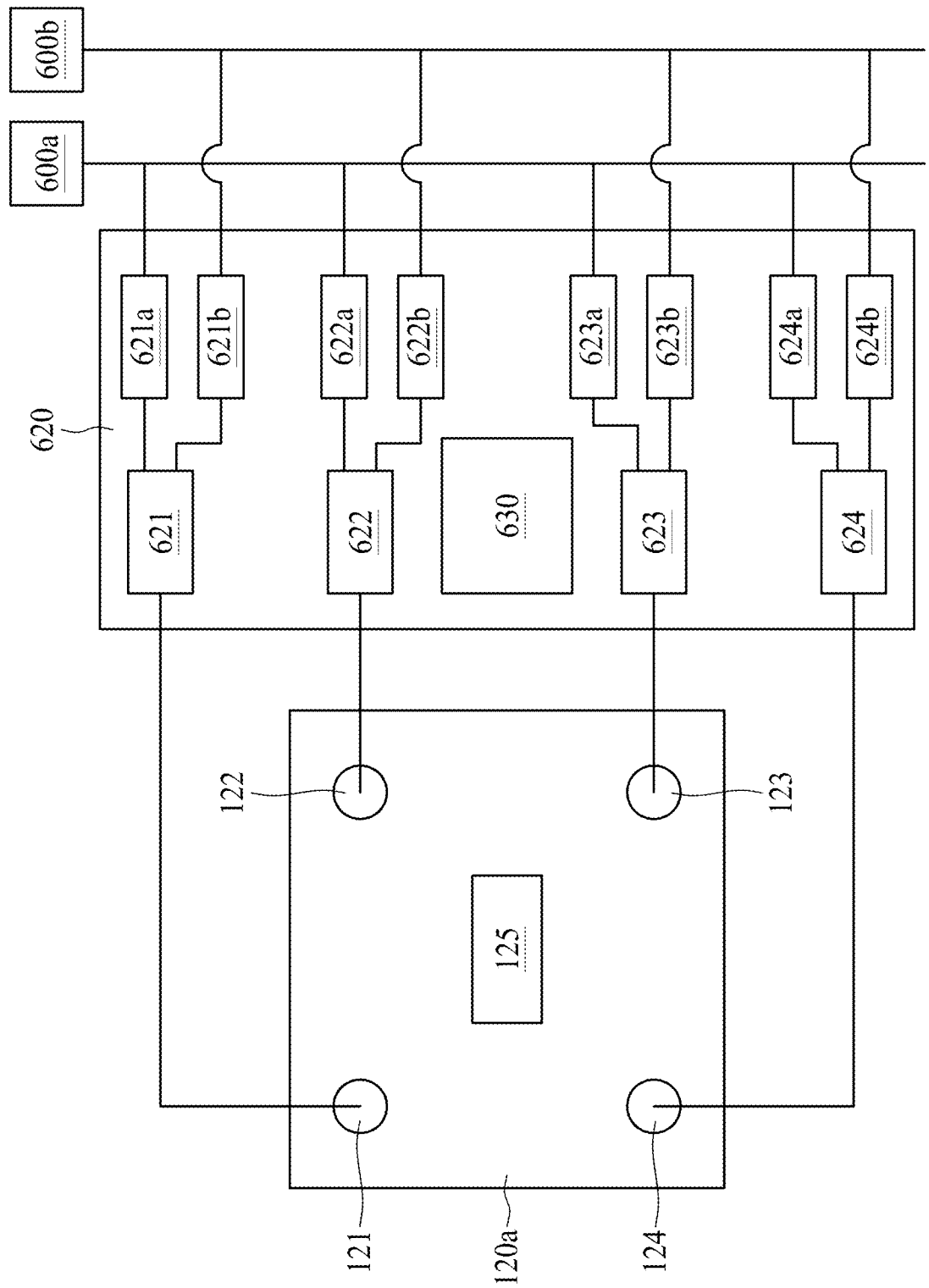
FIG. 7 is a schematic diagram of the connection from a gas source and a gas tank to the bottom of the FOUP according to some embodiments of the present disclosure.

FIG. 7 illustrates the connection from the gas source 600a and the gas tank 600b to the bottom 120a of the FOUP 100. As illustrated in FIG. 7, the gas source 600a and the gas tank 600b are connected to the ports 121 to 124 of the bottom 120a through the gas gate 620. To facilitate understanding, the pipes 601 to 604 and the nozzles 611 to 614 are omitted from FIG. 7.

The gas gate 620 includes switch units 621 to 624 configured to control the gas flow from the gas source 600a to the FOUP 100, or control the gas flow from the FOUP 100 to the gas tank 600b. Each of the switch units 621 to 624 connects the gas source 600a and the gas tank 600b to the ports 121 to 124, respectively. Therefore, the ports 121 to 124 may be controlled by the switch units 621 to 624 to connect to the gas source 600a or the gas tank 600b. In other words, the ports 121 to 124 can serve as intake ports or exhaust ports.

In some embodiments, the controller 630 determines whether the ports 121 to 124 are to serve as the intake port or the exhaust port according to a process configuration of the process being performed on the wafers 105. For example, in an embodiment, a cleaning process needs two intake ports and two exhaust ports, and the controller 630 controls the switch units 621 and 622 to connect the gas source 600a to the ports 121 and 122, and controls the switch units 623 and 624 to connect the gas tank 600b to the ports 123 and 124. In other words, the controller 630 determines a number of intake ports and a number of exhaust ports according to the process configuration of the cleaning process, and the gas purge device 600 performs the cleaning process based on the number of intake ports and the number of exhaust ports.

As shown in FIG. 7, each of the switch units 621 to 624 is further coupled to a pair of mass flow controllers (MFCs). For illustration, the switch unit 621 is coupled to an MFC 621a and an MFC 621b, the switch unit 622 is coupled to an MFC 622a and an MFC 622b, the switch unit 623 is coupled to an MFC 623a and an MFC 623b, and the switch unit 624 is coupled to an MFC 624a and an MFC 624b.

In some embodiments, the controller 630 determines the gas flow through the ports 121 to 124 according to the process configuration, and the controller 630 further controls the MFCs 621a, 621b, 622a, 622b, 623a, 623b, 624a and 624b to cause the desired gas flows.

The MFCs 621a, 622a, 623a and 624a connect the gas source 600a to the switch units 621, 622, 623 and 624, respectively. The MFCs 621a, 622a, 623a and 624a are configured to control and measure the gas flow from the gas source 600a to the switch units 621, 622, 623 and 624, respectively.

The MFCs 621b, 622b, 623b and 624b connect the gas tank 600b to the switch units 621, 622, 623 and 624, respectively. The MFCs 621b, 622b, 623b and 624b are configured to control and measure the gas flow from the switch units 621, 622, 623 and 624 to the gas tank 600b, respectively.

After the controller 630 determines the gas flow through the ports 121 to 124, the number of intake ports, and the number of exhaust ports, the overall gas flow of the gas provided by the gas source 600a and the overall gas flow of the gas removed from the FOUP 100 are determined. For example, when the number of intake ports and the number of exhaust ports are determined to be 2 and 2, respectively, the controller 630 controls 2 switch units (such as the switch units 621 and 622) to select the gas source 600a for providing the gas, and controls the other 2 switch units 623 and 624 to select the gas tank 600b for removing the gas from the FOUP 100. The controller 630 further controls the MFC 621a and the MFC 622a to cause the total gas flow to equal the determined overall gas flow of the gas provided by the gas source 600a, and controls the MFC 623b and the MFC 624b to cause the total gas flow to equal the determined overall gas flow of the gas removed to the gas tank 600b. In this example, the MFCs 621b, 622b, 623a and 624a are idle or set to have a gas flow equal to 0.

Figure 8:
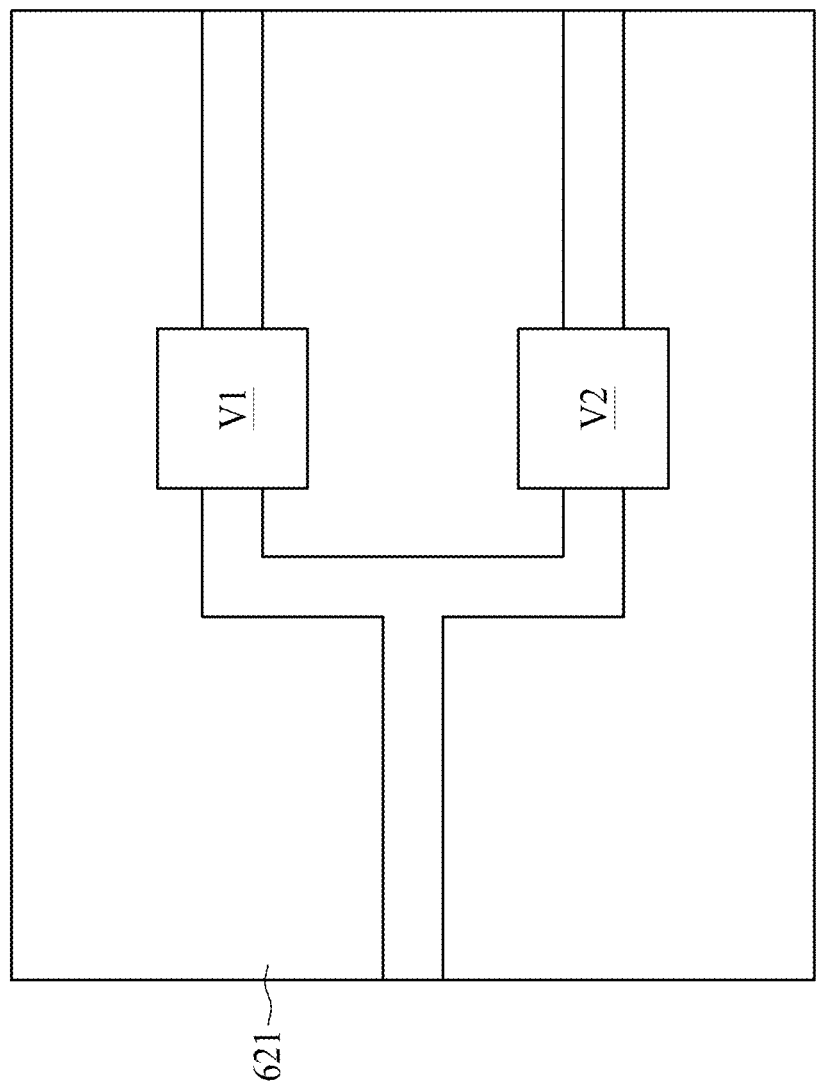
FIG. 8 is a schematic diagram of a switch unit of the gas purge device according to some embodiments of the present disclosure.

FIG. 8 illustrates the switch unit 621 according to some embodiments of the present disclosure. The switch unit 621 includes a valve V1 and a valve V2. The switch unit 621 connects to the MFC 621a through the valve V1, and connects to the MFC 621b through the valve V2.

When the port 121 is determined to be an intake port, the switch unit 621 is controlled to connect to the MFC 621a and disconnect from the MFC 621b. Under this condition, the valve V1 is open, and the valve V2 is closed.

When the port 121 is determined to be an exhaust port, the switch unit 621 is controlled to connect to the MFC 621b and disconnect from the MFC 621a. Under this condition, the valve V2 is open, and the valve V1 is closed.

The valve V1 and the valve V2 cannot be open at the same time. However, when the cleaning process does not need the port 121 to transport gas, the valve V1 and the valve V2 are both closed.

Each of switch units 622 to 624 also includes two valves. The operations of the switch units 622 to 624 are similar to those of the switch unit 621. Thus, descriptions of the operations of valves of the switch units 622 to 624 are not repeated herein.

Figure 9:
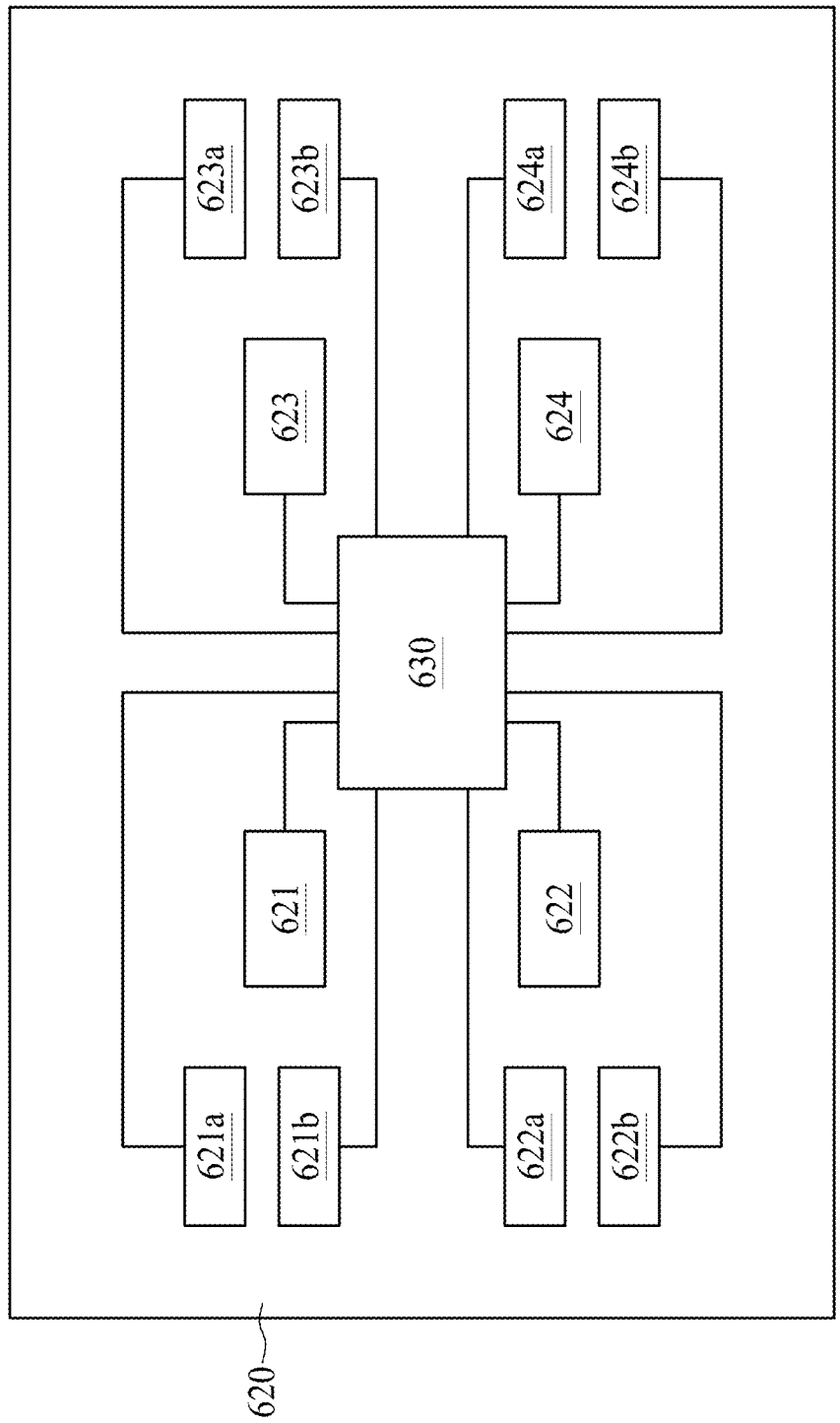
FIG. 9 is a block diagram of a gas gate of the gas purge device according to some embodiments of the present disclosure.

FIG. 9 illustrates a block diagram of a gas gate 620 according to some embodiments of the present disclosure. The switch units 621 to 624 and the MFCs 621a, 621b, 622a, 622b, 623a, 623b, 624a and 624b are electrically coupled to the controller 630 and are controlled by the controller 630.

Figure 10:
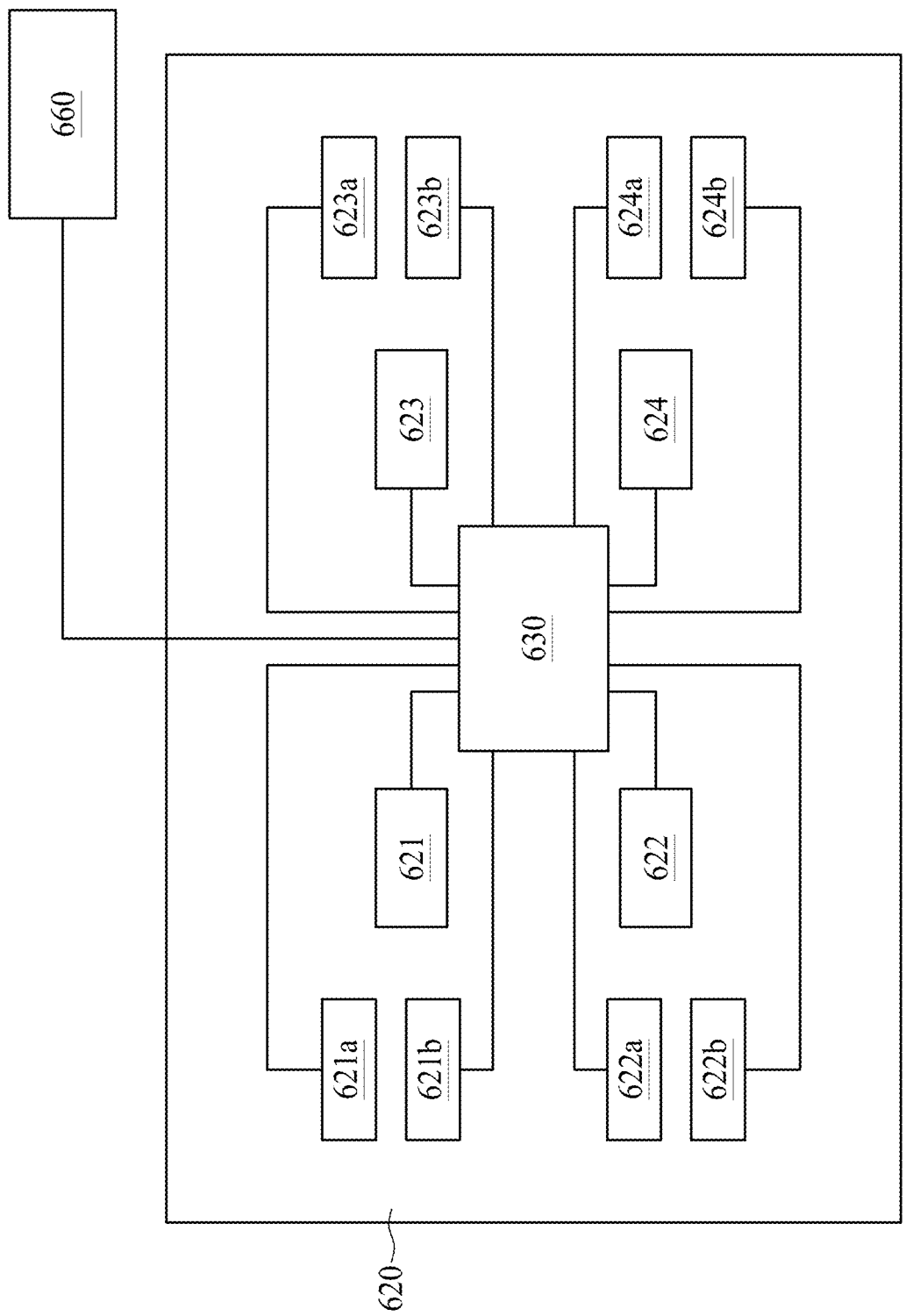
FIG. 10 is a block diagram of the gas gate of the gas purge device according to other embodiments of the present disclosure.

In some embodiments, the gas purge device 600 further includes a sensor 660. The sensor 660 is configured to generate a sensing signal by sensing a humidity and/or a concentration of the gas in the FOUP 100. FIG. 10 illustrates a block diagram of a gas gate 620 with the sensor 660 according to some embodiments of the present disclosure. Similar to the block diagram shown in FIG. 9, as illustrated in FIG. 10, the controller 630 is further electrically coupled to the sensor 660 for receiving the sensing signal.

In some embodiments, the controller 630 is able to control the MFCs 621*a*, 621*b*, 622*a*, 622*b*, 623*a*, 623*b*, 624*a* and 624*b* to adjust the gas flow based on the received sensing signal. For example, when the concentration of the gas (in the FOUP 100) provided by the gas source 600*a* exceeds a pre-determined value during the cleaning process, the sensor 660 generates the sensing signal indicating that the concentration of the gas from the gas source 600*a* is too high. The controller 630 receives the sensing signal and controls at least one MFC which is connected to the gas source 600*a* to decrease the gas flow, so as to decrease the concentration of the gas in the FOUP 100 to adjust the process back to desired conditions.

In some embodiments, the definitions (intake or exhaust) of the ports 121 to 124 vary with different processes and also vary with different FOUPs. FIG. 11 to FIG. 14 illustrate the gas purge device 600 being operated under different definitions of the ports 121 to 124. It should be noted that only the gas gate 620, the bottom 120*a* of the FOUP 100, the gas source 600*a* and the gas tank 600*b* are illustrated in FIG. 11 to FIG. 14, and other components are omitted to facilitate understanding.

Figure 11:
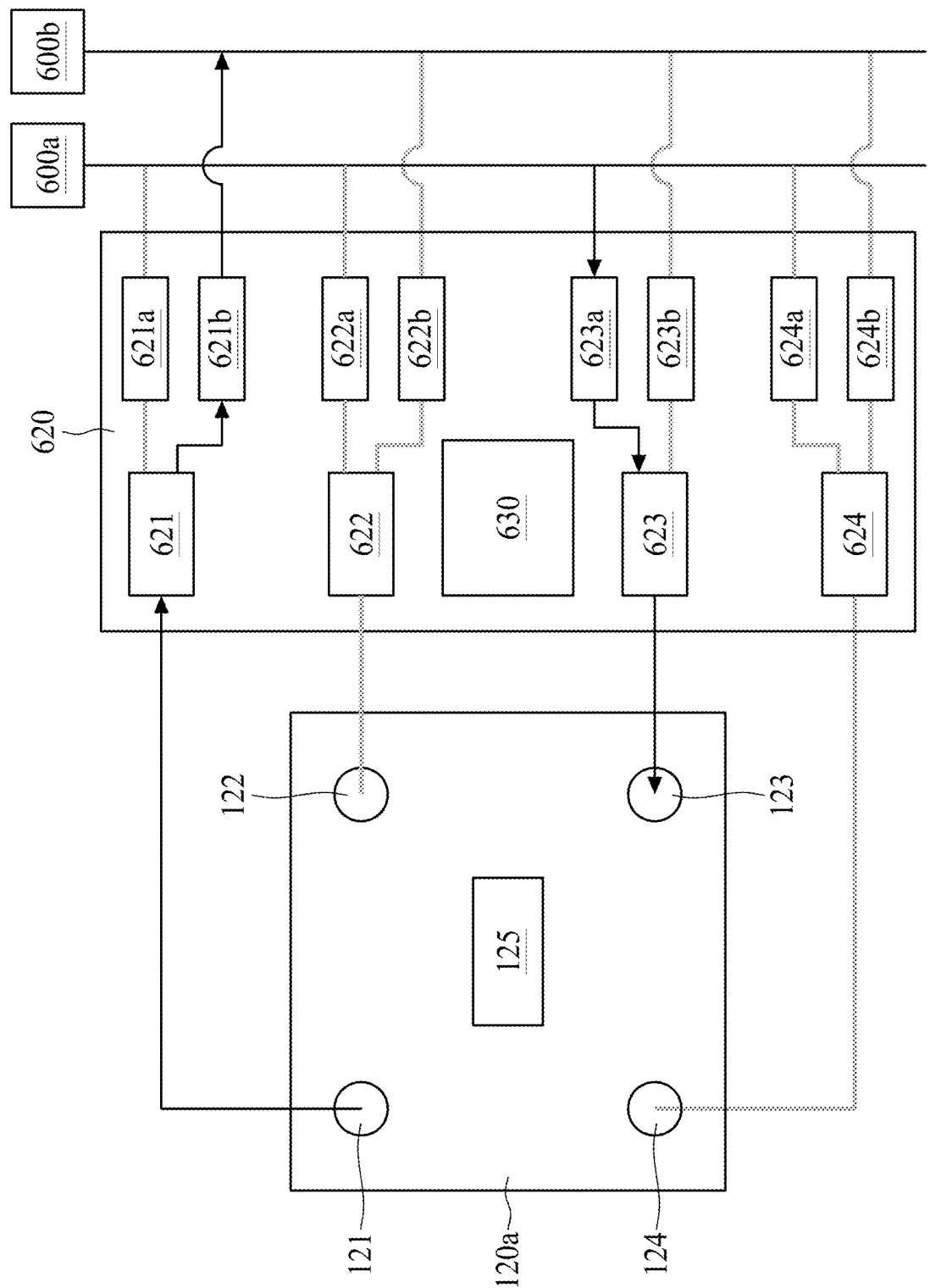
FIG. 11 is a schematic view of operations of the gas gate device according to some embodiments of the present disclosure.

Reference is made to FIG. 11. In some embodiments, the FOUP 100 only needs the port 121 and the port 123 to perform the process. In such embodiments, the FOUP 100 only uses the port 121 and the port 123. Therefore, the nozzles 611 and 613 are connected to the ports 121 and 123, respectively, and the nozzles 612 and 614 are idle.

In the embodiment of FIG. 11, the controller 630 determines that number of exhaust ports is one and the number of intake ports is one. The controller 630 controls the switch unit 621 to select the gas tank 600*b* for removing the gas from the FOUP 100 through the port 121, and controls the switch unit 623 to select the gas source 600*a* for providing the gas to the FOUP 100 through the port 123.

The MFC 621*b* is configured to control the gas flow from the port 121, and the MFC 621*a* is idle or sets the gas flow to 0. The MFC 623*a* is configured to control the gas flow from the gas source 600*a*, and the MFC 623*b* is idle or sets the gas flow to 0. Because the nozzle 612 and the nozzle 614 are not used, the MFCs 622*a*, 622*b*, 624*a* and 624*b* are idle or set the gas flows to 0. In other words, the gas pathways from the gas source 600*a* to the ports 122 and 124 and the gas pathways from the ports 122 and 124 to the gas tank 600*b* are disconnected. The grey lines in FIG. 11 indicate that there are no gas pathways therebetween.

Figure 12:
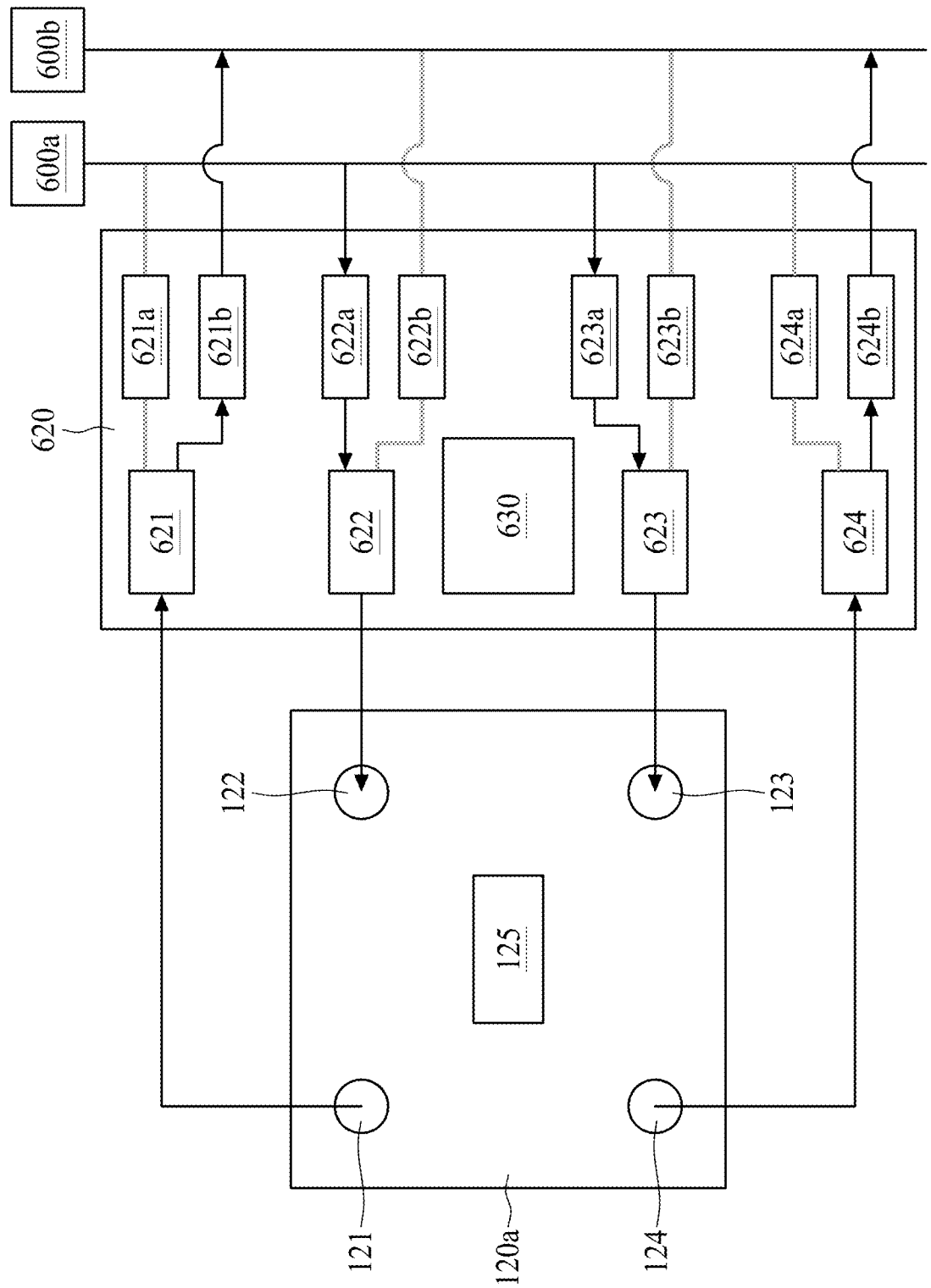
FIG. 12 is a schematic view of operations of the gas gate device according to other embodiments of the present disclosure.

Reference is made to FIG. 12. In some embodiments, the FOUP 100 needs two intake ports and two exhaust ports to perform the process. In the embodiment of FIG. 12, the controller 630 determines that the number of exhaust ports is two and the number of intake ports is two. The controller 630 controls the switch unit 621 and the switch unit 624 to select the gas tank 600*b* for removing the gas from the FOUP 100 through the port 121 and the port 124, respectively, and controls the switch unit 622 and the switch unit 623 to select the gas source 600*a* for providing the gas to the FOUP 100 through the port 122 and the port 123, respectively.

The MFC 621*b* is configured to control the gas flow from the port 121, and the MFC 621*a* is idle or sets the gas flow to 0. The MFC 624*b* is configured to control the gas flow from the port 124, and the MFC 624*a* is idle or sets the gas flow to 0. The MFC 622*a* is configured to control the gas flow from the gas source 600*a*, and the MFC 622*b* is idle or sets the gas flow to 0. The MFC 623*a* is configured to control the gas flow from the gas source 600*a*, and the MFC 623*b* is idle or sets the gas flow to 0. In other words, the gas pathways from the gas source 600*a* to the switch units 621 and 624 are disconnected, and the gas pathways from the switch units 622 and 623 to the gas tank 600*b* are disconnected. The grey lines in FIG. 12 indicate that there are no gas pathways therebetween.

Figure 13:
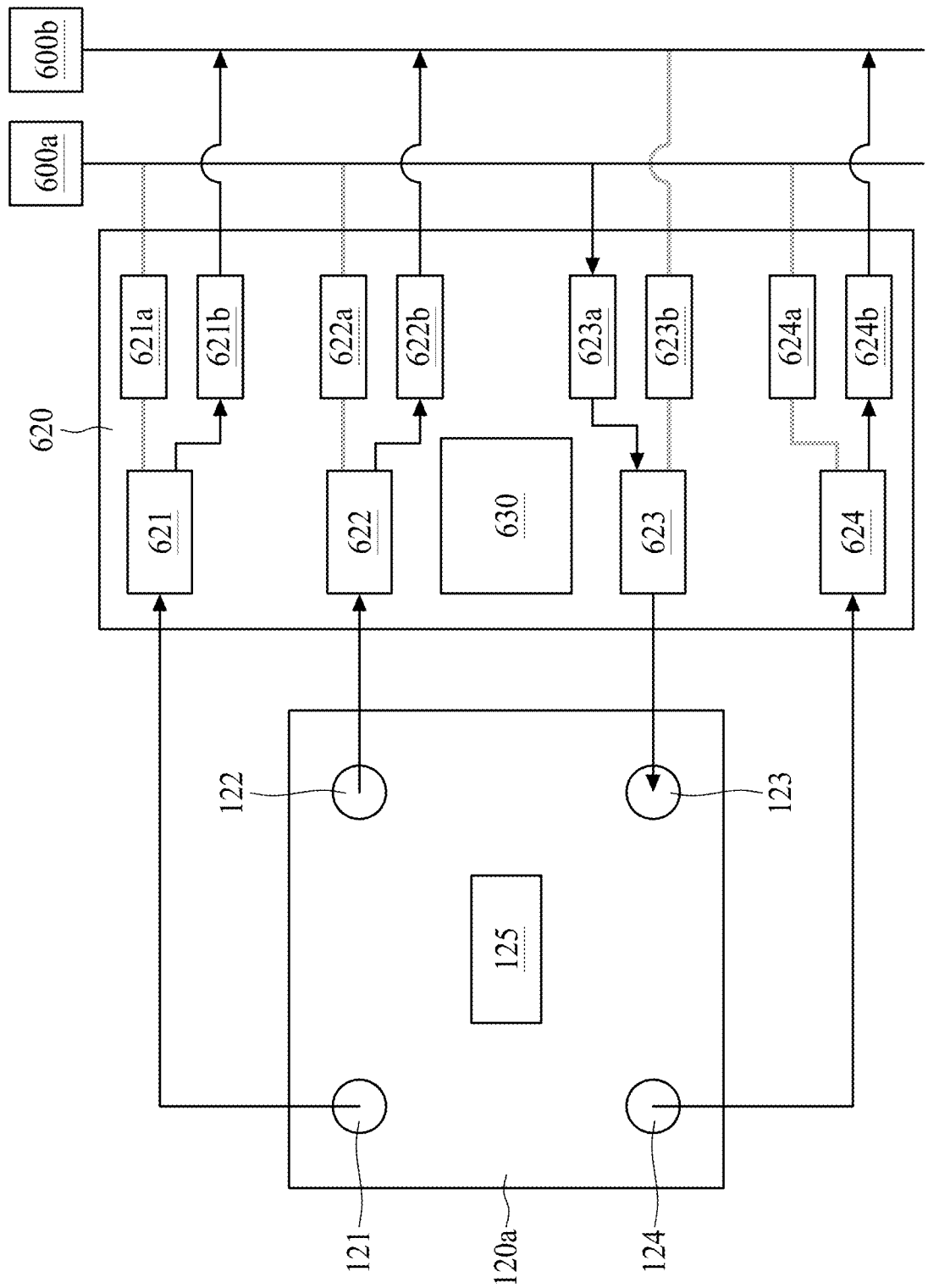
FIG. 13 is a schematic view of operations of the gas gate device according to various embodiments of the present disclosure.

Reference is made to FIG. 13. In some embodiments, the FOUP 100 needs one intake port and three exhaust ports to perform the process. In the embodiment of FIG. 13, the controller 630 determines that number of exhaust ports is three and the number of intake ports is one. The controller 630 controls the switch unit 621, the switch unit 622 and the switch unit 624 to select the gas tank 600*b* for removing the gas from the FOUP 100 through the port 121, the port 122 and the port 124, respectively, and controls the switch unit 623 to select the gas source 600*a* for providing the gas to the FOUP 100 through the port 123.

The MFC 621*b* is configured to control the gas flow from the port 121, and the MFC 621*a* is idle or sets the gas flow to 0. The MFC 622*b* is configured to control the gas flow from the port 122, and the MFC 622*a* is idle or sets the gas flow to 0. The MFC 624*b* is configured to control the gas flow from the port 124, and the MFC 624*a* is idle or sets the gas flow to 0. The MFC 623*a* is configured to control the gas flow from the gas source 600*a*, and the MFC 623*b* is idle or sets the gas flow to 0. In other words, the gas pathways from the gas source 600*a* to the switch units 621, 622 and 624 are disconnected, and the gas pathway from the switch unit 623 to the gas tank 600*b* is disconnected. The grey lines in FIG. 13 indicate that there are no gas pathways therebetween.

Figure 14:
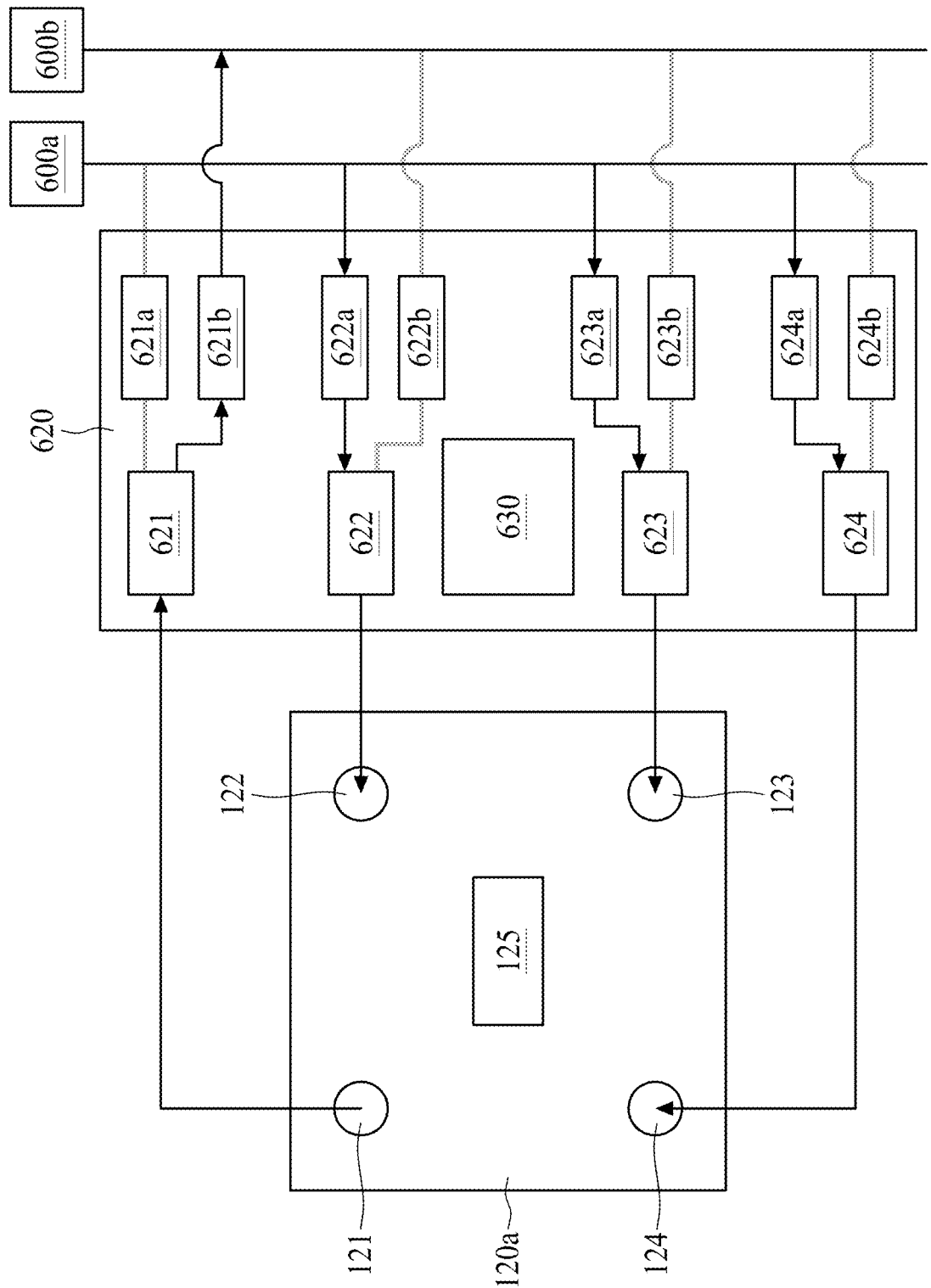
FIG. 14 is a schematic view of operations of the gas gate device according to alternative embodiments of the present disclosure.

Reference is made to FIG. 14. In some embodiments, the FOUP 100 needs three intake ports and one exhaust port to perform the process. In the embodiments of FIG. 14, the controller 630 determines that number of exhaust ports is one and the number of intake ports is three. The controller 630 controls the switch unit 621 to select the gas tank 600*b* for removing the gas from the FOUP 100 through the port 121, and controls the switch unit 622, the switch unit 623 and the switch unit 624 to select the gas source 600*a* for providing the gas to the FOUP 100 through the port 122, the port 123 and the port 124, respectively.

The MFC 621*b* is configured to control the gas flow from the port 121, and the MFC 621*a* is idle or sets the gas flow to 0. The MFC 622*a* is configured to control the gas flow from the gas source 600*a*, and the MFC 622*b* is idle or sets the gas flow to 0. The MFC 623*a* is configured to control the gas flow from the gas source 600*a*, and the MFC 623*b* is idle or sets the gas flow to 0. The MFC 624*a* is configured to control the gas flow from the gas source 600*a*, and the MFC 624*b* is idle or sets the gas flow to 0. In other words, the gas pathway from the gas source 600*a* to the switch unit 621 is disconnected, and the gas pathways from the switch units 622, 623 and 624 to the gas tank 600*b* are disconnected. The grey lines in FIG. 14 indicate that there are no gas pathways therebetween.

The abovementioned operations of the gas purge device 600 in FIG. 11 to FIG. 14 are provided for illustrative purposes. Various operations of the gas purge device 600 are within the contemplated scope of the present disclosure. For example, in various embodiments, the FOUP 100 needs two intake ports and one exhaust port to perform the process.

Figure 15:
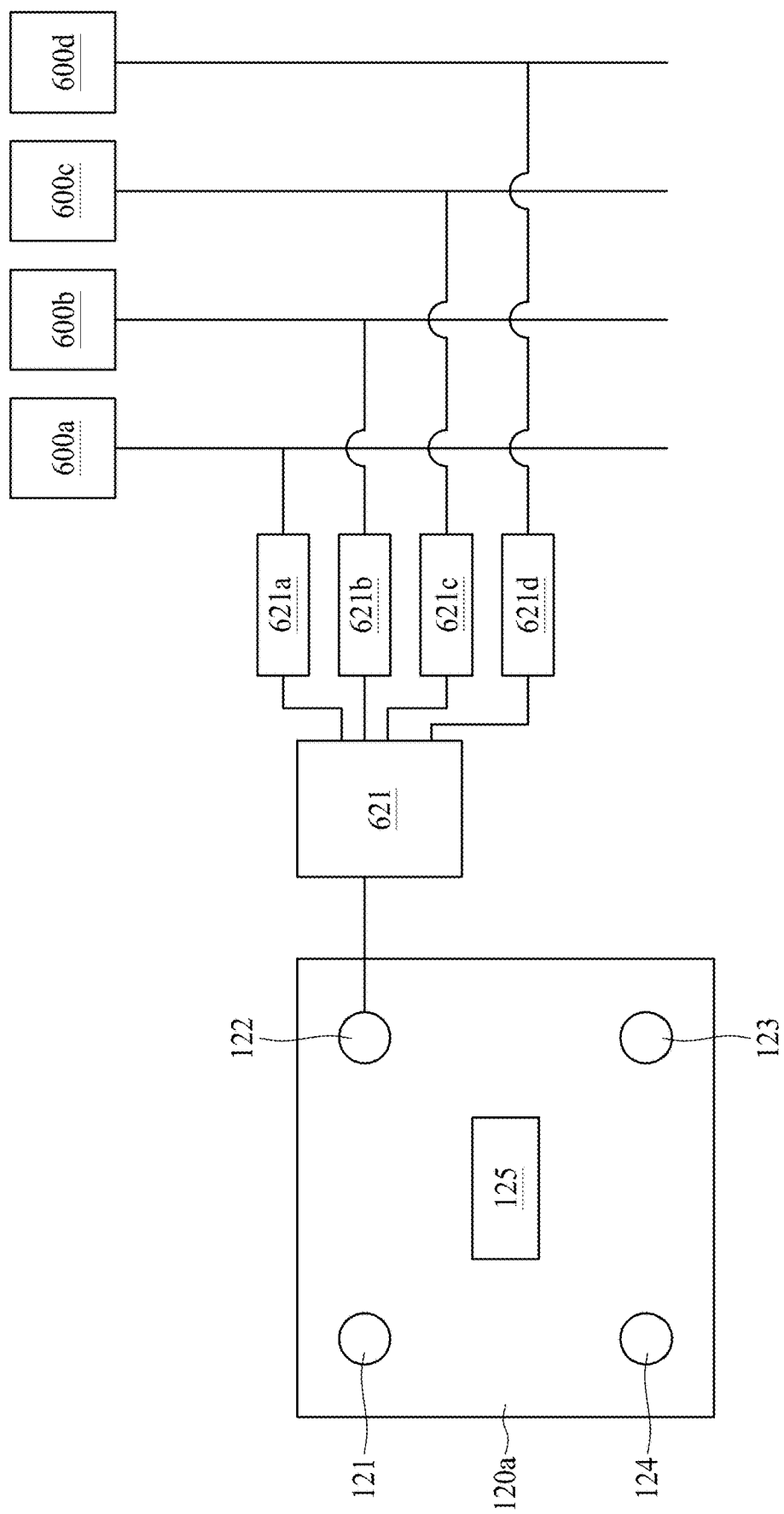
FIG. 15 is a schematic diagram of the gas purge device according to other embodiments of the present disclosure.

Reference is made to FIG. 15. In some embodiments, the wafers 105 further need an additional gas source 600c and/or gas source 600d to perform the cleaning process, in which the gas provided by the gas source 600c and the gas source 600d is different from the gas provided by the gas source 600a. The gas purge device 600 is further coupled to the gas source 600c and the source 600d.

In the embodiment of FIG. 15, the gas gate 620 further includes an MFC 621c coupled between the switch unit 621 and the gas source 600c, and includes an MFC 621d coupled between the switch unit 621 and the gas source 600d. When the port 121 is determined to be an intake port, the switch unit 621 is configured to select the gas source 600a, the gas source 600c, or the gas source 600d for providing the gas, and the MFC 621a, the MFC 621c or the MFC 621d is configured to control the gas flow into the port 121.

The gas gate 620 further includes an MFC 622c, an MFC 622d, an MFC 623c, an MFC 623d, an MFC 624c and an MFC 624d (not shown) coupled to the switch units 622, 623 and 624. The MFCs 622c, 622d, 623c, 623d, 624c and 624d are similar to the MFC 621c and the MFC 621d; therefore, the descriptions of the MFCs 622c, 622d, 623c, 623d, 624c and 624d are not repeated herein. Also, the MFCs 622c, 622d, 623c, 623d, 624c and 624d are omitted from FIG. 15 for simplicity.

Figure 16:
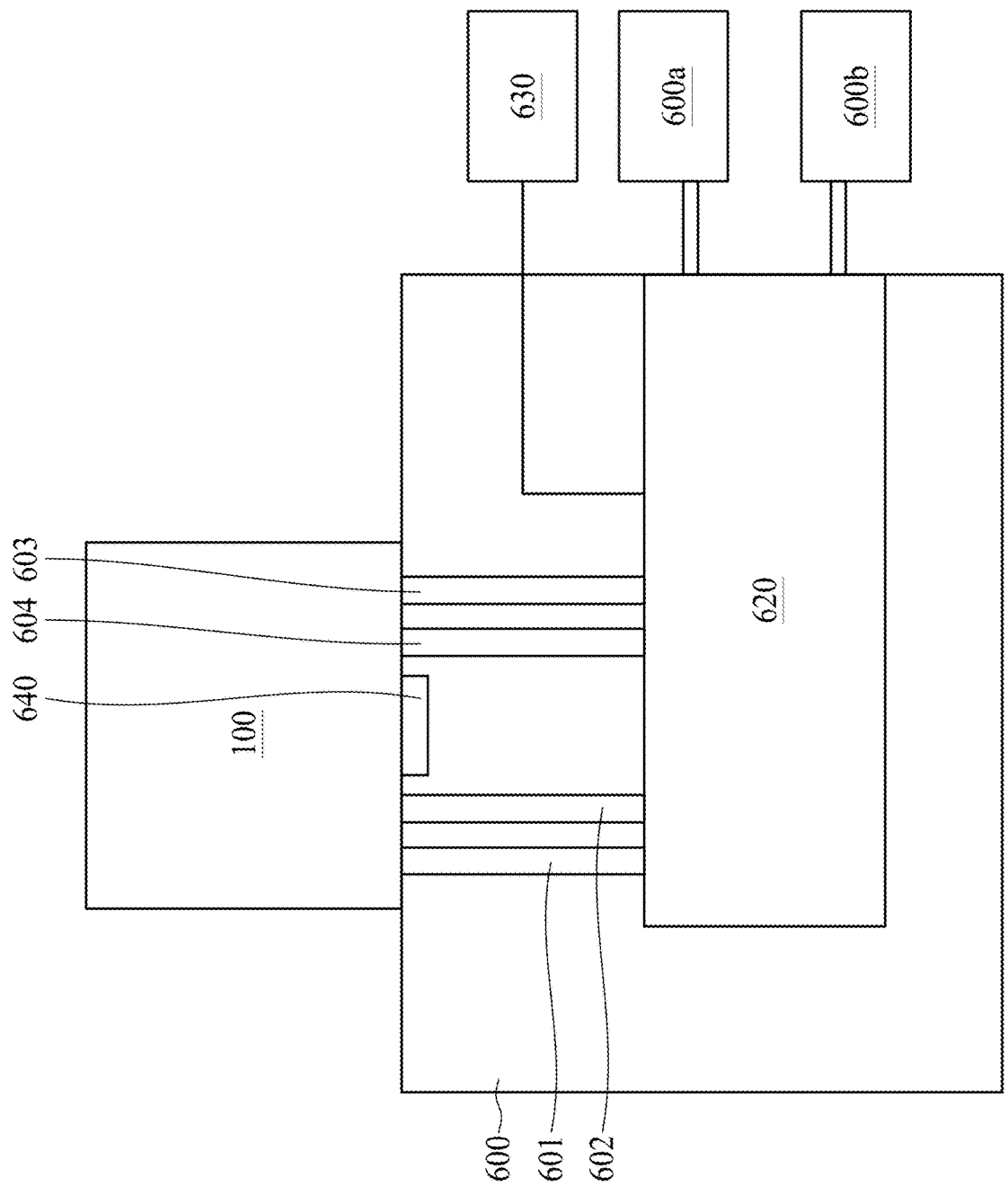
FIG. 16 is a schematic diagram of a gas purge device with the FOUP according to other embodiments of the present disclosure.

In some embodiments, the controller 630 is implemented outside of the gas gate 620, as illustrated in FIG. 16. The controller 630 may be shared with other semiconductor equipment.

Figure 17:
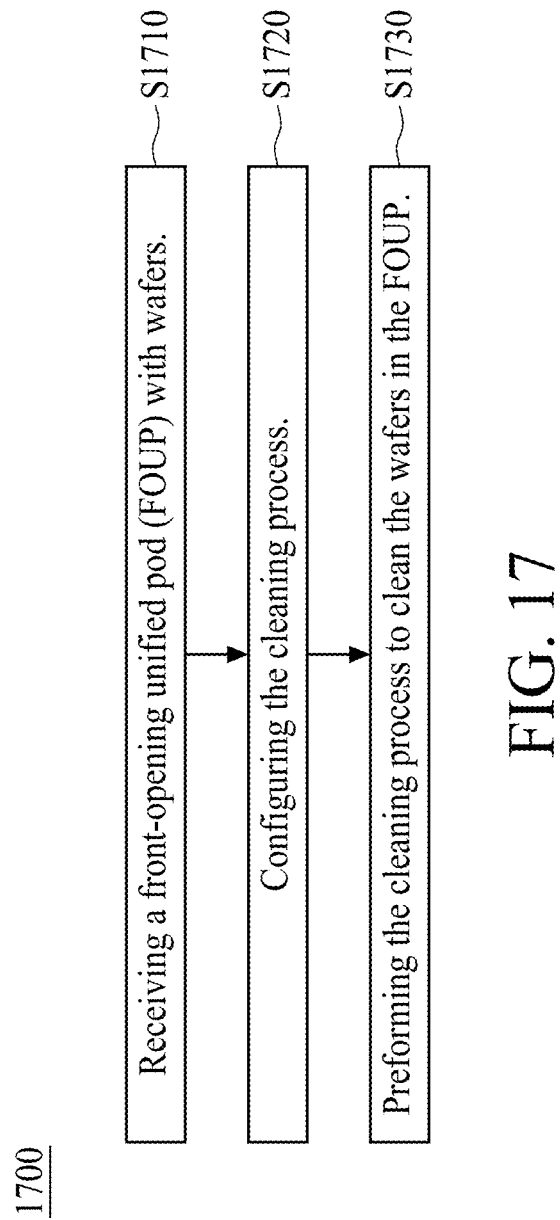
FIG. 17, FIG. 18, FIG. 19 and FIG. 20 are flowchart diagrams of the gas purge method according to some embodiments of the present disclosure.

Reference is made to FIG. 17 to FIG. 20. FIG. 17 to FIG. 20 are flowcharts of the gas purge method 1700 according to some embodiments of the present disclosure. As illustrated in FIG. 17, the method 1700 includes operations S1710, S1720 and S1730. Detailed operations of the gas purge method 1700 are described below.

In operation S1710, the FOUP 100 with the wafer 105 inside is received by the gas purge device 600. In operation S1720, the gas purge device 600 performs the configuration of the cleaning process. In operation S1730, the gas purge device 600 preforms the cleaning process to clean the wafers 105 in the FOUP 100 based on the configuration of the cleaning process.

Figure 18:
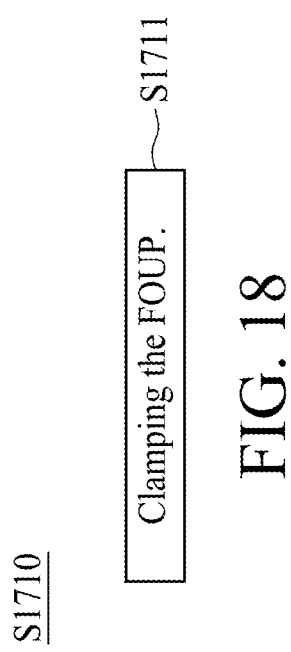

In some embodiments as shown in FIG. 18, the operation S1710 may include operation S1711. In operation S1711, the clamper clamps the coupling groove 125 of the FOUP 100 and the mechanism 640 of the gas purge device 600.

Figure 19:
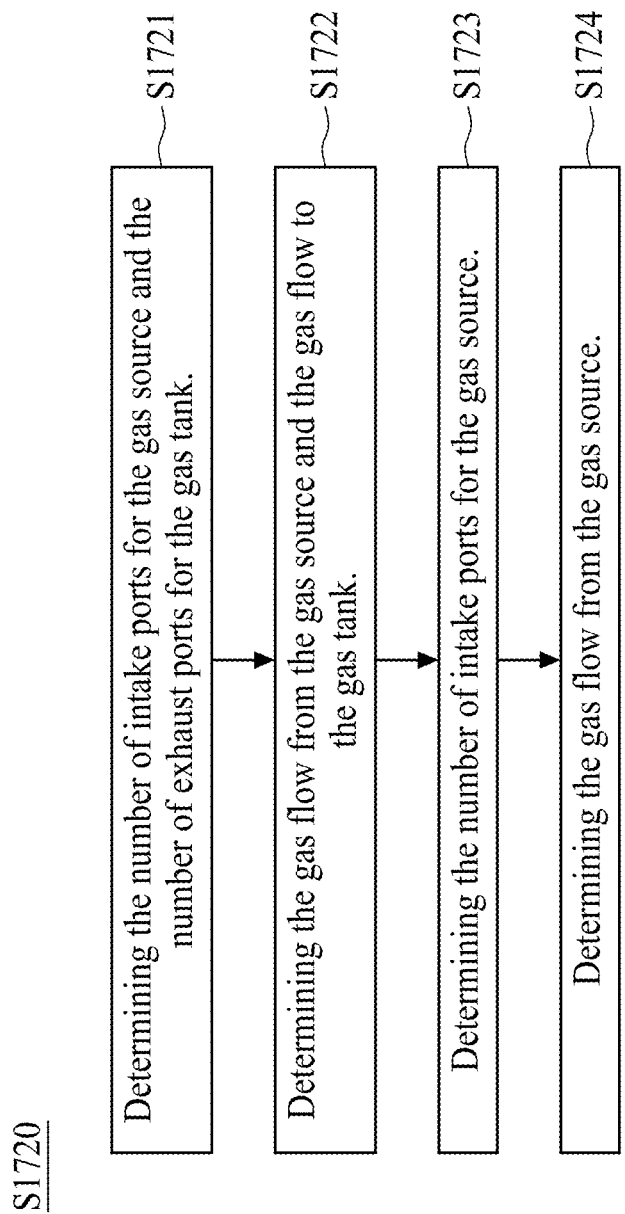

In some embodiments as shown in FIG. 19, the operation S1720 may include operations S1721, S1722, S1723 and S1724. In operation S1721, the gas purge device 600 determines the number of intake ports for the gas source 600a and the number of exhaust ports for the gas tank 600b. In operation S1722, the gas purge device 600 determines the gas flow from the gas source 600a and the gas flow to the gas tank 600b. In operation S1723, the gas purge device 600 determines the number of intake ports for the gas source 600c. In operation S1724, the gas purge device 600 determines the gas flow from the source 600c. In some embodiments, the operation S1720 may further determine the number of intake ports for the gas source 600d, and configured to determine the gas flow from the gas source 600d.

Figure 20:
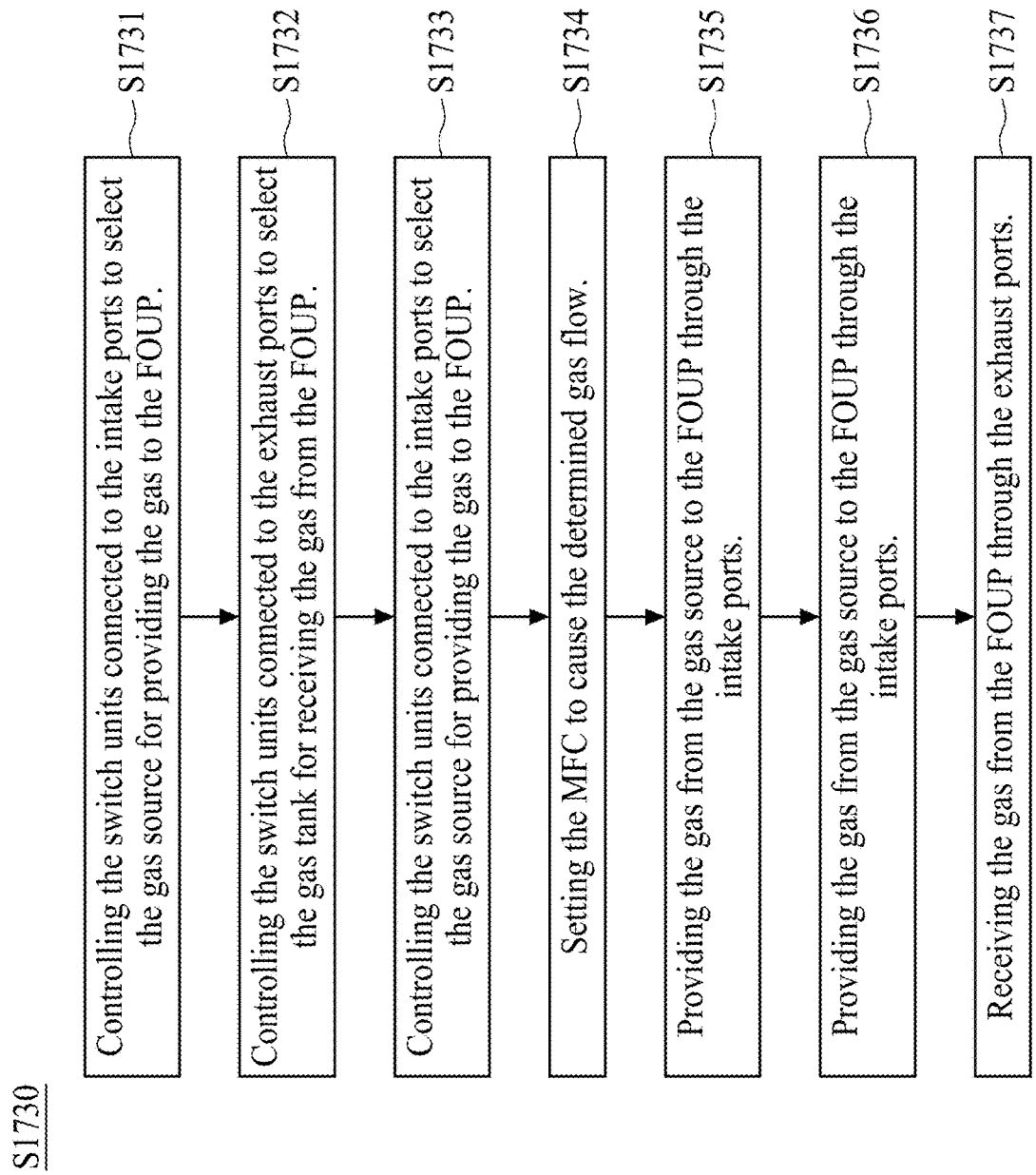

In some embodiments as shown in FIG. 20, the operation S1730 may include operations S1731, S1732, S1733, S1734, S1735, S1736 and S1737. In operation S1731, the gas purge device 600 controls the corresponding switch units connected to the intake ports to select the gas source 600a for providing the gas to the FOUP 100. In operation S1732, the gas purge device 600 controls the corresponding switch units connected to the exhaust ports to select the gas tank 600b for receiving the gas from the FOUP 100. In operation S1733, the gas purge device 600 controls the corresponding switch units connected to the intake ports to select the gas source 600c for providing the gas to the FOUP 100. In operation S1734, the gas purge device 600 sets the corresponding MFC to cause the determined gas flow. In operation S1735, the gas purge device 600 provides the gas from the gas source 600a to the FOUP 100 through the corresponding intake ports. In operation S1736, the gas purge device 600 provides the gas from the gas source 600c to the FOUP 100 through the corresponding intake ports. In operation S1737, the gas purge device 600 receives the gas from the FOUP 100 through the corresponding exhaust ports. In some embodiments, the operation S1730 may be further configured to control the corresponding switch unit connected to the intake port to select the gas source 600d providing the gas to the FOUP 100, and further configured to set the corresponding MFC to cause a determined gas flow from the gas source 600d.

In some approaches, the wafer containers have different configurations such as different numbers of ports for gas flow. When a purge device performs a purge process on a different wafer container, the purge device must undergo hardware modification to comply with requirements of the different wafer containers. However, hardware modification is costly. The cost of the purge process is thus increased due to the different wafer containers.

Compared to the above approaches, in some embodiments of the present disclosure, the gas purge device 600 and the gas purge method 1700 are able to control the switch units 621 to 624 to select the gas source 600a or the gas tank 600b, so as to provide the gas to the FOUP 100 or remove the gas from the FOUP 100. The hardware modification is unnecessary even when the FOUPs 100 have different configurations. Therefore, using the gas purge device 600 and the gas purge method 1700 can decrease the cost of the process and reduce the time required for hardware modification.

One aspect of the present disclosure provides a gas purge device, including a first nozzle and a gas gate. The first nozzle is coupled to a FOUP through a first port of the FOUP. The gas gate is coupled to the first nozzle via a first pipe. The gas gate includes an MFC, a second MFC and a first switch unit. The first MFC is configured to control a first flow of a first gas. The second MFC is configured to control a second flow of a second gas. The first switch unit is coupled to the first MFC and the second MFC, and configured to provide the first gas to the first nozzle through the first pipe or receive the second gas from the first nozzle through the first pipe according to a process configuration.

Another aspect of the present disclosure provides a method including the following operations: receiving a FOUP with wafers therein by a gas purge device; determining a first number of first intake ports of the gas purge device and a second number of second exhaust ports of the gas purge device; and, based on the first number and the second number, cleaning the wafers in the FOUP. Cleaning the wafers includes: providing, by a gas gate of the gas purge device, a first flow of a first gas through the first intake ports to the FOUP; receiving, by the gas gate, a second flow of a second gas from the FOUP through the second exhaust ports.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A gas purge device, comprising:
   a first nozzle coupled to a front-opening unified pod (FOUP) through a first port of the FOUP; and
   a gas gate coupled to the first nozzle via a first pipe, wherein the gas gate comprises:
   a first mass flow controller (MFC) configured to control a first flow of a first gas provided from a first gas source;
   a second MFC configured to control a second flow of a second gas discharged to a gas tank; and
   a first switch unit coupled to the first MFC and the second MFC, and configured to provide the first gas from the first gas source to the first nozzle through the first pipe or receive the second gas from the first nozzle to the gas tank through the first pipe according to a process configuration;
   wherein the gas purge device is configured to provide the first gas to a plurality of wafers in the FOUP, and the wafers are 12-inch and/or 18-inch wafers;
   wherein the first switch unit comprises:
   a first valve configured to be opened to provide the first gas from a first gas source to the first nozzle; and
   a second valve configured to be opened to receive the second gas from the first nozzle to the gas tank;
   wherein when the first valve is open, the second valve is closed, and when the first valve is closed, the second valve is open.

2. The gas purge device of claim 1, further comprising:
   a mechanism configured to be clamped and connected to the FOUP.

3. The gas purge device of claim 1, wherein the gas gate further comprises:
   a ninth MFC configured to control a ninth flow of a third gas provided from a second gas source, wherein the third gas is different from the first gas and the second gas,
   wherein the first switch unit is further coupled to the ninth MFC, and configured to provide the third gas from the second gas source to the first nozzle through the first pipe.

4. The gas purge device of claim 3, wherein the gas gate further comprises:
   a tenth MFC configured to control a tenth flow of a fourth gas provided from a third gas source, wherein the fourth gas is different from the first gas, the second gas and the third gas,
   wherein the first switch unit is further coupled to the tenth MFC, and configured to provide the fourth gas from the third gas source to the first nozzle through the first pipe.

5. The gas purge device of claim 1, further comprising:
   a second nozzle coupled to the FOUP through a second port of the FOUP;
   wherein the gas gate is further coupled to the second nozzle via a second pipe, and the gas gate further comprises:
   a third MFC configured to control a third flow of the first gas provided from the first gas source;
   a fourth MFC configured to control a fourth flow of the second gas discharged to the gas tank; and
   a second switch unit coupled to the third MFC and the fourth MFC, and configured to provide the first gas from the first gas source to the second nozzle through the second pipe or receive the second gas from the second nozzle to the gas tank through the second pipe according to the process configuration.

6. The gas purge device of claim 5, wherein when the first gas is provided to the first nozzle by the first switch unit, the second gas is received from the second nozzle by the second switch unit.

7. The gas purge device of claim 5, further comprising:
   a third nozzle coupled to the FOUP through a third port of the FOUP; and
   a fourth nozzle coupled to the FOUP through a first port of the FOUP,
   wherein the gas gate is further coupled to the third nozzle and the fourth nozzle via a third pipe and a fourth pipe, respectively, and the gas gate further comprises:
   a fifth MFC configured to control a fifth flow of the first gas provided from the first gas source;
   a sixth MFC configured to control a sixth flow of the second gas discharged to the gas tank;
   a seventh MFC configured to control a seventh flow of the first gas provided from the first gas source;
   an eighth MFC configured to control an eighth flow of the second gas discharged to the gas tank;
   a third switch unit coupled to the fifth MFC and the sixth MFC, and configured to provide the first gas to the third nozzle through the third pipe or to receive the second gas from the third nozzle through the third pipe according to the process configuration; and
   a fourth switch unit coupled to the seventh MFC and the eighth MFC, and configured to provide the first gas to the fourth nozzle through the fourth pipe or to receive the second gas from the fourth nozzle through the fourth pipe according to the process configuration.

8. The gas purge device of claim 7, wherein the first gas is provided to the first nozzle by the first switch unit, and the second gas is received from the second nozzle, the third nozzle and the fourth nozzle by the second switch unit, the third switch unit and the fourth switch unit, respectively.

9. The gas purge device of claim 7, wherein the first gas is provided to the first nozzle and the third nozzle by the first switch unit and the third switch unit, respectively, and the second gas is received from the second nozzle and the fourth nozzle by the second switch unit and the fourth switch unit, respectively.

10. The gas purge device of claim 7, wherein the first gas is provided to the first nozzle, the third nozzle and the fourth nozzle by the first switch unit, the third switch unit and the fourth switch unit, respectively, and the second gas is received from the second nozzle by the second switch unit.

11. The gas purge device of claim 7, wherein the gas gate further comprises:
    a controller configured to control the first switch unit, the second switch unit, the third switch unit, the fourth switch unit, the first MFC, the second MFC, the third MFC, the fourth MFC, the fifth MFC, the sixth MFC, the seventh MFC and the eighth MFC.

12. The gas purge device of claim 11, wherein the controller is further configured to receive a sensing signal generated by a sensor, wherein the sensor is configured to sense a humidity, a concentration of the first gas, and/or a concentration of the second gas of the FOUP, wherein the controller further controls the first switch unit, the second switch unit, the third switch unit, the fourth switch unit, the first MFC, the second MFC, the third MFC, the fourth MFC, the fifth MFC, the sixth MFC, the seventh MFC and the eighth MFC according to the sensing signal.

13. The gas purge device of claim 12, wherein the controller is implemented by a programmable logic controller (PLC).

14. A gas purging method, comprising:
receiving, by a gas purge device, a front-opening unified pod (FOUP) with wafers therein;
determining a first number of first intake ports of the FOUP and a second number of second exhaust ports of the FOUP; and
based on the first number and the second number, cleaning the wafers in the FOUP, wherein cleaning the wafers comprises:
providing, by a gas gate of the gas purge device, a first flow of a first gas through the first intake ports to the FOUP; and
receiving, by the gas gate, a second flow of a second gas from the FOUP through the second exhaust ports;
wherein cleaning the wafers further comprises:
controlling the first number of switch units connected to the first intake ports to select a first gas source for providing the first gas to the FOUP; and
controlling the second number of switch units connected to the second exhaust ports to select a gas tank for receiving the second gas from the FOUP.

15. The gas purging method of claim 14, further comprising:
determining the first flow of the first gas and the second flow of the second gas,
wherein cleaning the wafers further comprises:
setting the first number of first mass flow controllers (MFCs) to have a first overall flow equal to the first flow; and
setting the second number of second MFCs to have a second overall flow equal to the second flow,
wherein the first MFCs are connected to the first gas source, and the second MFCs are connected to the gas tank, and
wherein a sum of the first number and the second number is equal to 4, and the first number and the second are greater than 0.

16. A gas purging method, comprising:
receiving, by a gas purge device, a front-opening unified pod (FOUP) with wafers therein;
determining a first number of first intake ports of the FOUP and a second number of second exhaust ports of the FOUP; and
based on the first number and the second number, cleaning the wafers in the FOUP, wherein cleaning the wafers comprises:
providing, by a gas gate of the gas purge device, a first flow of a first gas through the first intake ports to the FOUP;
receiving, by the gas gate, a second flow of a second gas from the FOUP through the second exhaust ports; and
determining a third number of third intake ports of the gas purge device,
wherein cleaning the wafers further comprises:
controlling a third number of switching units connected to the third intake ports to select a second gas source for providing a third gas to the FOUP;
setting a third number of third MFCs to have a third overall flow equal to a third flow; and
providing, by the gas gate, the third flow of the third gas through the third number of third intake ports to the FOUP.

* * * * *